(12) United States Patent
Hilbert et al.

(10) Patent No.: US 10,197,656 B2
(45) Date of Patent: Feb. 5, 2019

(54) METHOD FOR RECORDING A PARAMETER MAP BY MEANS OF A MAGNETIC RESONANCE DEVICE, AND MAGNETIC RESONANCE DEVICE

(71) Applicant: Siemens Aktiengesellschaft, Munich (DE)

(72) Inventors: Tom Hilbert, Lausanne (CH); Tobias Kober, Lausanne (CH); Gunnar Krüger, Watertown-Boston, MA (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 822 days.

(21) Appl. No.: 14/667,937

(22) Filed: Mar. 25, 2015

(65) Prior Publication Data

US 2015/0285879 A1 Oct. 8, 2015

(30) Foreign Application Priority Data

Apr. 3, 2014 (DE) .................. 10 2014 206 395

(51) Int. Cl.
*G01R 33/48* (2006.01)
*G01R 33/50* (2006.01)
*G01R 33/561* (2006.01)

(52) U.S. Cl.
CPC ......... *G01R 33/4818* (2013.01); *G01R 33/50* (2013.01); *G01R 33/5611* (2013.01); *G01R 33/5619* (2013.01)

(58) Field of Classification Search
CPC .. G01R 33/4818; G01R 33/482; G01R 33/50; G01R 33/5611; G01R 33/5619
See application file for complete search history.

(56) References Cited

U.S. PATENT DOCUMENTS 6,841,998 B1  1/2005  Griswold
2011/0254549 A1* 10/2011  Lin .................. G01R 33/5611
                                                              324/309

(Continued)

FOREIGN PATENT DOCUMENTS

CN  102540125 A  7/2012
DE  102010061977 A1  5/2012

OTHER PUBLICATIONS

Chinese Office Action and English translation thereof dated Apr. 18, 2016.

(Continued)

*Primary Examiner* — Rishi Patel
(74) *Attorney, Agent, or Firm* — Harness, Dickey & Pierce, P.L.C.

(57) ABSTRACT

A method is disclosed for recording a parameter map of a target region via a magnetic resonance device. In at least one embodiment, an optimization method is used for the iterative reconstruction of the parameter map. In the optimization method, the deviation of undersampled magnetic resonance data of the target region present in the k-space for different echo times, magnetic resonance data of a portion of the k-space being present in each case for each echo time, is assessed from hypothesis data of a current hypothesis for the parameter map obtained as a function of the parameter from a model for the magnetization. To determine the magnetic resonance data of a portion of the k-space, undersampled raw data is initially acquired within the portions by way of the magnetic resonance device embodied for parallel imaging, and missing magnetic resonance data within the portions is completed by way of interpolation.

14 Claims, 3 Drawing Sheets

(56) References Cited

U.S. PATENT DOCUMENTS

| | | | |
|---|---|---|---|
| 2012/0133361 A1 | 5/2012 | Gross | |
| 2013/0088225 A1 | 4/2013 | Weller | |
| 2013/0207652 A1* | 8/2013 | Weller | G01R 33/5611 |
| | | | 324/309 |
| 2013/0214781 A1* | 8/2013 | Hernando | G01R 33/4828 |
| | | | 324/309 |
| 2013/0343624 A1* | 12/2013 | Thibault | G06T 11/006 |
| | | | 382/131 |

OTHER PUBLICATIONS

M. Griswold, "Generalized autocalibrating partial parallel acquisitions (GRAPPA)", Magnetic Resonance in Medicine 47, Wiley-Liss, Inc. (2002) 6, 9 pages.

T. Sumpf, "Model-based nonlinear inverse reconstruction for T2 mapping using highly undersampled spin-echo MRI", Journal of Magnetic Resonance Imaging 34 (2011) 2, 9 pages.

Pruessmann Klaas P. et al.: "SENSE: Sensitivity Encoding for Fast MRI", in: Magnetic Resonance in Medicine, Band 42, pp. 952-962; 1999; DE.

Griswold M. A. et al.: "Generalized Autocalibrating Partially Parallel Acquisitions (GRAPPA)", in: Magnetic Resonance in Medicine, vol. 47, pp. 1202-1210, 2002.

Tilman J. et al., "Model-based nonlinear inverse reconstruction for T2 mapping using highly undersampled spin-echo MRI", in: Journal of Magnetic Resonance Imaging, vol. 34, pp. 420-428, 2011 2.

Pang Y. et al; "Interpolated Compressed Sensing for 2D Multiple Slice Fast MR Imaging"; PLos ONE; vol. 8, Issue 2, Article e56098; pp. 1-5; 2013.

Sumpf T.J. et al; "Model-Based Nonlinear Inverse Reconstruction for T2 Mapping Using Highly Undersampled Spin-Echo MRI", in: Journal of Magnetic Resonance Imaging, vol. 34, pp. 420-428, 2011.

Huang C. et al; "T2 Mapping from Highly Undersampled Data by Reconstruction of Principal Component Coefficient Maps Using Compressed Sensing", in: Magnetic Resonance in Medicine, vol. 67, pp. 1355-1366, 2012.

Velikina et al; "Accelerating MR Parameter Mapping Using Sparsity-Promoting Regularization in Parametric Dimension", in: Magnetic Resonance in Medicine, vol. 70, pp. 1263-1273; 2013.

Hilbert T., "Accelerated Quantitative Mapping of Relaxation Times in MRI"; Universität Heidelberg—Hochschule Heilbronn; pp. 1-71; 2013.

Chinese Office Action and English translation thereof dated Apr. 27, 2017.

Korean Office Action dated Oct. 6, 2016.

* cited by examiner

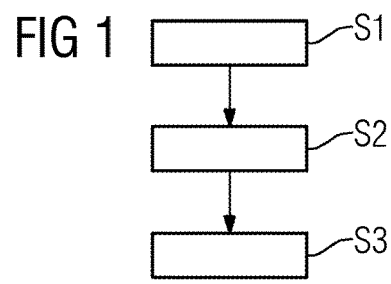
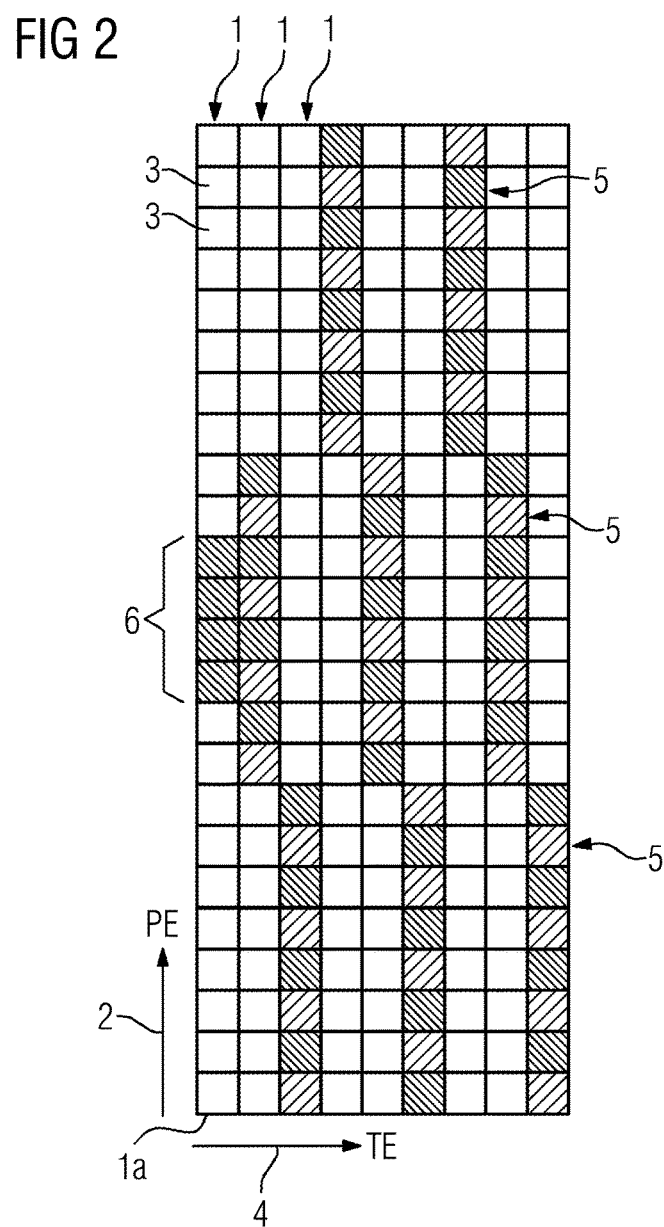

US 10,197,656 B2

METHOD FOR RECORDING A PARAMETER MAP BY MEANS OF A MAGNETIC RESONANCE DEVICE, AND MAGNETIC RESONANCE DEVICE

PRIORITY STATEMENT

The present application hereby claims priority under 35 U.S.C. § 119 to German patent application number DE 102014206395.7 filed Apr. 3, 2014, the entire contents of which are hereby incorporated herein by reference.

FIELD

At least one embodiment of the invention generally relates to a method for recording a parameter map of a target region via a magnetic resonance device, wherein an optimization method may be used for the iterative reconstruction of the parameter map, in which optimization method the deviation of undersampled magnetic resonance data of the target region present in the k-space for different echo times, wherein magnetic resonance data of a portion of the k-space is present in each case for each echo time, is assessed from hypothesis data of a current hypothesis for the parameter map obtained as a function of the parameter from a signal model for the magnetization. At least one embodiment of the invention additionally relates to a magnetic resonance device.

BACKGROUND

Magnetic resonance imaging is already extensively known in the prior art. Spins of a target region that is to be imaged are aligned by way of a maximally homogeneous basic magnetic field (B0 field) and excited by way of a radiofrequency excitation, the corresponding magnetic resonance signal that is to be measured describing the decay of the excitation. The field of the radiofrequency excitation is often referred to as the B1 field. A plurality of decay constants are known in this context, in particular T1, T2 and T2*. A spatial resolution is achieved in most cases through the use of gradient fields.

Magnetic resonance imaging is an inherently slow imaging technology which often requires long measurement times. It does, however, offer a great number of image contrasts and has proven itself to be an excellent method for achieving soft part contrasts. The usual contrast that is visible in conventional magnetic resonance images is the result of a combination of different physical parameters of a tissue of a patient that is to be scanned. This mix of factors, in combination with the acquisition technique applied and the acquisition parameters used, determines the contrast obtained.

An approach for obtaining contrast information of biological tissue via magnetic resonance imaging which departs from these "classical" magnetic resonance images is the direct measurement of one or more of the underlying physical properties which are part of the mix that determines the image contrast in the conventional magnetic resonance image. These techniques are commonly referred to as "parametric mapping" and accordingly deliver parameter maps, for example T1 maps, T2 maps or T2* maps. When approaches of the type are used, the resulting image contrast is more independent of the hardware used, the acquisition technique employed and the specific image acquisition parameters used. This advantageously results in a simplification in terms of comparability and consequently clinical diagnosis. Thus, for example, a database of comparative parameter values can be built up, with which values a new parameter dataset, i.e. a new parameter map, can be compared. This means, in other words, that a transition is made from the relative contrast information, which is dependent on many factors, to a single, absolute measure of one or more physical properties.

Techniques for determining parameter maps have been known for a long time already and generally necessitate extremely time-consuming measurements which in the past have severely constrained the clinical benefits. In this regard, methods have recently been proposed in order to accelerate the measurement process by way of an undersampling of the k-space. The undersampling is compensated for by prior knowledge about the measured magnetic resonance signal, wherein, for example, a signal model can be used for the magnetic resonance signal describing the magnetization. It is then possible to determine the parameter map in an iterative optimization method. The class to which these methods belong is usually referred to as model-based approaches.

The magnetic resonance data is typically acquired in the k-space, i.e. in the Fourier domain. It can be demonstrated mathematically that a specific volume of data must be sampled in order to reconstruct a magnetic resonance image free of aliasing artifacts. This correlation is also referred to as the Nyquist sampling theorem. It is nonetheless conceivable that parts of the sampled k-space data are redundant or that prior knowledge is present which can be used in order to synthesize parts of the k-space data, such that there is by all means the possibility to sample less data in the k-space than is demanded by the Nyquist theorem. In a typical acquisition scan, the measurement time scales with the volume of sampled data, so by way of undersampling it is possible to achieve a reduction in the measurement time.

However, data sampling in the sub-Nyquist regime demands new reconstruction techniques that go beyond the immediate Fourier transformation and require prior knowledge about redundancies in the data or the anticipated behavior thereof in order to determine the non-sampled part of the magnetic resonance data. In the context of the exploitation of data redundancies, parallel imaging is a way to achieve an acceleration of an acquisition process. In parallel imaging, a plurality of receive coils are used in parallel during the imaging process. This means that magnetic resonance signals are picked up by a plurality of coils, with the result that redundancy is present. A well-known example of a parallel imaging algorithm is the "generalized autocalibrating partial parallel acquisition", GRAPPA for short, cf. in this regard, for example, the fundamental article by Mark A. Griswold et al. titled "Generalized autocalibrating partial parallel acquisitions (GRAPPA)", Magnetic Resonance in Medicine 47 (2002) 6, 1202-1210.

In the context of the determination of parameter maps, the already mentioned model-based approaches have primarily become known, an example hereof being the "model-based accelerated relaxometry by iterative non-linear inversion" technique, MARTINI for short, which is to be described; cf. in this regard also the article by Tilman J. Sumpf et al. titled "Model-based nonlinear inverse reconstruction for T2 mapping using highly undersampled spin-echo MRI", Journal of Magnetic Resonance Imaging 34 (2011) 2, pages 420-428.

In model-based approaches of this type, therefore, undersampled magnetic resonance data is acquired in the k-space. The signal model (model for the magnetization) now permits hypothesis data serving as comparative data to be determined from a hypothesis for the parameter map. A deviation can be determined by comparing the hypothesis data with the magnetic resonance data. The hypothesis is now iteratively adapted in the optimization method as a function of the deviation or the ultimately obtained best hypothesis is output as the result for the parameter map if an abort condition has been met.

This shall be explained in greater detail hereinbelow briefly for the MARTINI reconstruction technique.

As has already been described, the contrast obtained in a magnetic resonance image acquisition is determined by different physical parameters of the scanned tissue in the target region, just as well as by the acquisition technique and the image acquisition parameters. If it is now assumed that all of these factors are known, the magnetic resonance signal (i.e. the magnetization) can be predicted, with the result that a signal model can be determined for the image acquisition process. An example of such a signal model for a multi-echo spin-echo magnetic resonance sequence is the monoexponential signal decay, which is defined as:

$$M(\vec{r}) = \rho(\vec{r}) e^{-TE/T2(\vec{r})},$$

where M is the magnetization at the spatial position $\vec{r}$ as a function of two tissue parameters, specifically the proton density $\rho$ and the transverse relaxation time T2. The magnetization M is additionally dependent on the predefined image acquisition parameter, echo time TE. As parameters for the parameter map, the tissue parameters $\rho$ and T2 are usually the variables that are to be measured.

It is clear from this example how a model can be used in order to determine the tissue parameters as a parameter map, in this case the proton density $\rho$ and the transverse relaxation time T2. If it is assumed that the resulting magnetic resonance signal M is sampled at a sufficiently large number of echo times TE, the hypotheses for the tissue parameters can be determined by way of a simple curve fitting algorithm. This process is generally performed in an iterative manner. The example also reveals in which way the signal model contains prior knowledge: If the signal model is used as a cost function in an iterative optimization process, the described signal behavior can be imposed on the undersampled magnetic resonance data, as a result of which the desired parameters are effectively estimated in the signal model. MARTINI exploits this prior knowledge by undersampling the k-space in a specific manner on the one hand, and on the other hand using the underlying signal model in order to formulate an inverse problem for a nonlinear iterative reconstruction.

In this case, given knowledge of the iterative reconstruction scheme used, the manner in which the k-space is undersampled can be optimized. The MARTINI reconstruction technique uses a block sampling scheme, which means that the k-space is sampled one block at a time, i.e. in contiguous blocks, the position of the block being changed for each echo time TE. It is therefore conceivable, for example, to deconstruct the k-space in the phase encoding direction into a plurality of equal-sized portions which are repeatedly sampled in succession for different echo times.

Once all the undersampled magnetic resonance data has been acquired, an iterative reconstruction is performed, as already mentioned, in which a rough estimation of the parameter maps is assumed as a hypothesis. The parameter maps are continuously improved in each iteration step using an optimizer which utilizes the prior information, in actuality the measured undersampled magnetic resonance data and the above-described hypothesis data determined from the signal model with the aid of the hypothesis. After a specific number of iterations, either a threshold for the permitted iteration steps is exceeded or the deviation with respect to the magnetic resonance data falls below a predefined maximum permitted threshold value.

In spite of the model-based approaches which permit an undersampling of the k-space in order to determine parameter maps, the measurement times for the parameter maps are still quite long, thus making an improvement desirable in this regard. An additional factor is that determining parameter maps by way of the MARTINI reconstruction technique is susceptible to errors originating from violations of the signal model, i.e. parts of the magnetic resonance data in which the signal model is not suitable for approximating the measured magnetic resonance data. Magnetic resonance data acquired in vivo has various sources of violations of the signal model, these being caused by the blood flow, partial volume effects, head motion, noise and other effects. For this reason an improvement of the model-based approaches is also desirable in this regard.

SUMMARY

At least one embodiment of the invention is directed to a method for determining a parameter map which is more robust against violations of the signal model and enables faster measurement times.

A method is disclosed to determine the magnetic resonance data of a portion of the k-space, undersampled raw data is acquired initially within the portions by way of the magnetic resonance device embodied for parallel imaging, and missing magnetic resonance data within the portions is completed by way of interpolation.

In addition to the method, at least one embodiment of the present invention also relates to a magnetic resonance device having a control device embodied for carrying out the method according to at least one embodiment of the invention. In this case the control device is normally the same control device that also handles the rest of the control of the magnetic resonance device, so it may therefore have a sequencer unit which can also be used for the acquisition of the raw data. Toward that end, the other components of the magnetic resonance device, in particular a gradient coil array and/or at least one radiofrequency coil array, are driven or read out accordingly. The magnetic resonance device can further comprise an interpolation unit in which complete magnetic resonance data is derived from the raw data for the individual portions by way of interpolation. The parameter maps are derived in a reconstruction unit by way of a model-based approach. Generally, all statements made with regard to the method according to the invention can be applied analogously to the magnetic resonance device according to the invention, such that the cited advantages can also be achieved by way of the device through the combination of parallel imaging interpolation methods and model-based approaches, in particular through the combination of GRAPPA and MARTINI.

BRIEF DESCRIPTION OF THE DRAWINGS

Further advantages and details of the present invention will become apparent from the example embodiments described hereinbelow as well as with reference to the drawing, in which:

FIG. 1 is a flowchart of the method according to an embodiment of the invention, FIG. 2 shows a sampling scheme used in the k-space.

DETAILED DESCRIPTION OF THE EXAMPLE EMBODIMENTS

Figure 3:
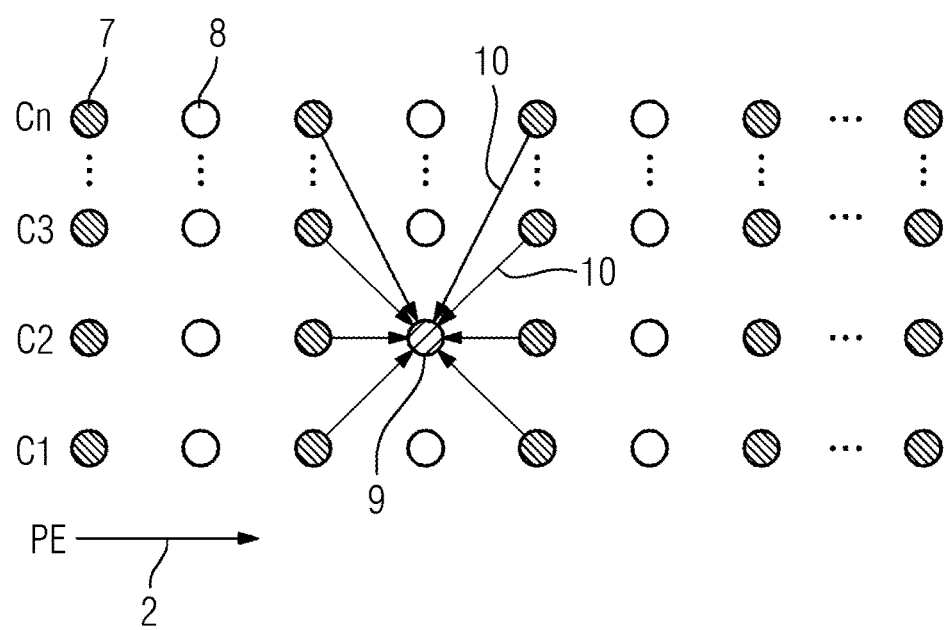
FIG. 3 shows a schematic illustrating the interpolation of missing magnetic resonance data from the raw data.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

A method is disclosed to determine the magnetic resonance data of a portion of the k-space, undersampled raw data is acquired initially within the portions by way of the magnetic resonance device embodied for parallel imaging, and missing magnetic resonance data within the portions is completed by way of interpolation.

As has already been explained, the model-based approaches for determining parameter maps make use of an undersampling scheme which in each case acquires only a portion of the entire k-space for each echo time, which means that undersampling is already provided in this regard. The portions are preferably blocks, such that the magnetic resonance data is therefore available block by block for different echo times. Preferably, different portions complement one another seamlessly to form the entire k-space that is to be sampled and are sampled sequentially, this sequence being repeated for all echo times at which a data acquisition is performed; in this way an acceleration of the measurement can already be achieved by a factor equal to the number of portions used.

At least one embodiment of the present invention now proposes to introduce a further undersampling, preferably by the factor 2, also within the portions, in particular blocks, and in so doing to use parallel imaging techniques, consequently to insert redundancy information owing to the use of a plurality of receive coils or receive coil elements in order, in a first reconstruction step, to complete the magnetic resonance data from the different raw data sources by way of interpolation.

At least one embodiment of the invention therefore proposes combining the undersampling and interpolation of methods using parallel imaging in order to accelerate the measurement time with model-based undersampling approaches for determining parameter maps in order on the one hand to achieve a more robust reconstruction. This increased robustness can be used to increase the undersampling even further so that an acceleration of the measurement time also results.

A particularly advantageous embodiment of the present invention provides in this case that the reconstruction of the parameter maps is performed with the aid of a MARTINI reconstruction technique and/or the acquisition and interpolation of the magnetic resonance data are performed according to the GRAPPA method. Both the MARTINI reconstruction technique and the GRAPPA method are already well-known in the prior art, for example from the cited articles, with reference additionally being made to U.S. Pat. No. 6,841,998 in respect of the GRAPPA method, the entire contents of which is hereby incorporated herein by reference.

As has already been mentioned, conventional model-based approaches, in particular the MARTINI reconstruction technique, are extremely sensitive to violations of the signal model. In a conventional MARTINI reconstruction, the signal energy of the artifacts manifests itself in accordance with the point spread function (PSF) for the actual sampling. The combination of model-based approaches and parallel imaging approaches which perform their interpolation in the k-space, in particular, therefore, the combination of MARTINI and GRAPPA, reveals itself as more robust against violations of the signal model, since a reduced energy of the aliasing artifacts results in comparison with the corresponding conventional model-based reconstruction. The added interpolation changes the effective PSF of the model-based approach and in this way reduces the existing artifacts.

In spite of the slight violations of the signal model that occur due to the acceleration achieved by way of parallel imaging, in particular GRAPPA, the described improvement in respect of the artifacts considerably outweighs in the resulting image quality. The robustness thus obtained can be used to derive high-quality parameter maps also from highly undersampled raw data.

For the combination of MARTINI and GRAPPA in the quantitative determination of T2 parameter maps, it was possible to show that with an acceleration by the factor 5 (i.e. sampling of five blocks in the k-space) on the part of the model-based approach and an undersampling by the factor 2 within the portions (blocks), i.e. a tenfold acceleration, the parameter maps obtained are equivalent to those of a conventional fivefold-accelerated MARTINI reconstruction, with only an extremely small increase in noise occurring. Only an insignificant increase in the root mean square deviation (RMSD) occurs compared to the fully sampled reconstruction. In short, the method according to the invention delivers substantially the same result as a conventional MARTINI reconstruction in respect of the data quality, but requires only an acquisition of half the amount of data, with the result that a twofold additional acceleration is possible in this example embodiment. Similar quality retention has also been demonstrated with other acceleration factors on the part of the MARTINI reconstruction.

In a concrete embodiment of the present invention, it can be provided that in the case of a Cartesian sampling within the portions embodied in particular as blocks, only every second row in the k-space is sampled, insofar as the acquisition of the raw data is concerned. In a Cartesian sampling of the k-space, a row-by-row approach is typically adopted, the rows usually succeeding one another in the phase encoding direction and being sampled in the direction of the readout gradient.

For example, it can be provided in actuality that the k-space is partitioned in the phase encoding direction into n equal-sized sequential blocks as portions, one of the blocks being read out in each case for an echo time. Within the blocks it is then proposed to read out only every second row, which is equivalent to an acceleration by the factor 2 through the use of parallel imaging. The normally fully sampled blocks of the model-based approach are therefore twofold undersampled in that only every second row within each block is sampled. It is particularly advantageous in this connection if, in the case of at least one further sampling of a portion in the k-space at a different echo time, the rows sampled immediately previously are not sampled and the omitted rows are sampled. What is achieved as a result is that data is nonetheless present for all of the rows, even though for different echo times.

Overall, therefore, there results within the scope of at least one embodiment of the present invention a specific undersampling scheme for the k-space that is to be sampled, which scheme is defined on the one hand by the portions, obviously not containing the entire k-space that is to be sampled, but also by a further undersampling within the portions. As has already been mentioned, it can generally be provided that the k-space is subdivided in the phase encoding direction into three to five portions, in particular blocks, while other factors, for example 2 or even 10, can also be used for specific application cases. In that case the portions are preferably sampled repeatedly in a specific sequence for different echo times.

With regard to the interpolation, it can be provided that for interpolation purposes the raw data acquired adjacently in respect of the position of the missing magnetic resonance data item in the k-space is taken into account in a weighted manner in accordance with an interpolation kernel. This is a way to exploit the redundancy in the raw data which results from the acquisition of the magnetic resonance signal simultaneously by a plurality of receive coil elements. The missing magnetic resonance data in the undersampled raw data is interpolated using a weighted sum of adjacent sampled points. This procedure is performed in the k-space. An interpolation kernel containing the interpolation weights is used for the interpolation.

The interpolation kernel is typically generated using a fully sampled part of the k-space around the center of the k-space. Details of how such an interpolation kernel is trained on the basis of calibration data are already widely known in the prior art. It is therefore beneficial if the interpolation kernel is determined from calibration data of the target region acquired by way of the magnetic resonance device. In this case it is conceivable in principle that the calibration data is acquired in an additional, separate calibration measurement.

However, a particularly preferred embodiment of the present invention provides that the calibration data is acquired in the course of the measurement of the raw data, in particular by complete, non-undersampled acquisition of the k-space center at a first measured echo time. In this case the k-space center is to be understood in the present context as an area extending around the central point of the k-space.

In this embodiment, use is made of the fact that the at least one echo to be acquired first, i.e. the first measurable echo time, is generally not used in the MARTINI reconstruction. This is due, inter alia, to non-ideal magnetic resonance pulses which cause signal model violations at the start of the measurement time period. It is therefore convenient to use the echo time in order to acquire the calibration data. The acquisition of the calibration data is then incorporated into the overall acquisition process and the risk of a movement occurring in the target region is lower and no additional measurement time is required.

It can be provided in this case that the calibration data of the first echo time is then not used as magnetic resonance data in the optimization method, with reference being made to the reasons already cited. An acquisition step of the first measured echo time therefore advantageously relates to the acquisition of calibration data from the k-space center by which the interpolation kernel can be trained, for which purpose a least-squares algorithm can be used, for example. The interpolation kernel is then used to interpolate the missing magnetic resonance data in the portions, in other words, for example, missing rows in the k-space, in order to complete the portions.

If the magnetic resonance data has been completed firstly in the portions, in particular using GRAPPA, it is possible to apply a conventional MARTINI reconstruction or another model-based approach in order to derive the parametric maps in accordance with the underlying signal model of the magnetic resonance sequence. In this case it can for example be provided that a T2 parameter map and/or a T2* parameter map and/or a T1 parameter map and/or a proton density parameter map are/is determined. In addition to the T2 mapping already discussed in the introduction, the combination of acceleration techniques described here can also be used for other parameters, for example for the quantitative T2* mapping, in which case a GRE sequence (Gradient Recalled Echo sequence) is typically used. In this case the signal model for the monoexponential decay must be supplemented by a phase term, in other words $$M(\vec{r}) = \rho(\vec{r}) e^{-TE/T2^*(\vec{r})} e^{i2\pi b(\vec{r}) TE},$$

where b is the frequency shift over time in hertz.

Furthermore, the method according to at least one embodiment of the invention can also be used for T1 mapping when T1-weighted acquisitions are performed, for example by using a Look-Locker sequence. In this case the magnetic resonance signal is sampled at different time points after the application of an inversion pulse. The signal model must in this case be adapted in order to describe a monoexponential increase in the magnetization as a function of the inversion time TI.

$$M(\vec{r}) = \rho(\vec{r})(1 - e^{-TI/T1(\vec{r})})$$

It should also be pointed out at this juncture that in addition to the cited Cartesian sampling, the method according to at least one embodiment of the invention is also applicable to other sampling strategies, provided that the sampled portions are suitable for using parallel imaging interpolation methods. Radial or at least partially randomized samplings of the k-space may be cited in this regard by way of example.

In addition to the method, at least one embodiment of the present invention also relates to a magnetic resonance device having a control device embodied for carrying out the method according to at least one embodiment of the invention. In this case the control device is normally the same control device that also handles the rest of the control of the magnetic resonance device, so it may therefore have a sequencer unit which can also be used for the acquisition of the raw data. Toward that end, the other components of the magnetic resonance device, in particular a gradient coil array and/or at least one radiofrequency coil array, are driven or read out accordingly. The magnetic resonance device can further comprise an interpolation unit in which complete magnetic resonance data is derived from the raw data for the individual portions by way of interpolation. The parameter maps are derived in a reconstruction unit by way of a model-based approach. Generally, all statements made with regard to the method according to the invention can be applied analogously to the magnetic resonance device according to the invention, such that the cited advantages can also be achieved by way of the device through the combination of parallel imaging interpolation methods and model-based approaches, in particular through the combination of GRAPPA and MARTINI.

FIG. 1 shows a flowchart of an example embodiment of the method according to the invention. As can be seen, the method consists of three main steps S1 to S3, which are subdivided into various substeps, as are explained in more detail by FIGS. 2 to 4. In the present case an example embodiment is shown in which a first acceleration is effected by way of parallel imaging using the GRAPPA technique and a second acceleration is achieved by way of block-by-block acquisition of the k-space at different echo times and a MARTINI reconstruction.

Firstly, raw data is now acquired in a step S1. The data is undersampled in a twofold manner, as the sampling scheme of FIG. 2 is intended to explain in more detail. In this case each column 1 (along the phase encoding direction 2) corresponds to the entire k-space that is to be sampled in the phase encoding direction 2. A box 3 therefore symbolizes a phase encoding step, a Cartesian sampling of the k-space being performed in the present case, such that each box 3 symbolizes a row in the direction of the readout gradient. The second direction 4 shown symbolizes the echo time encoding, i.e. indicates the different echo times TE at which raw data is acquired via the magnetic resonance device.

As can easily be seen from FIG. 2, the k-space is subdivided in the phase encoding direction into three equal-sized, contiguous blocks 5. For each echo time at which raw data is to be acquired, magnetic resonance data for a third of the k-space is therefore to be present for the MARTINI technique following later in step S3. In the present case this would already be equivalent to a shortening of the measurement time by the factor 3, though higher acceleration factors are also conceivable here, for example an acceleration factor 5, in which the k-space is subdivided into five blocks along the phase encoding direction 2.

According to FIG. 2, the blocks 5 are sampled in a fixed sequence which constantly repeats itself, which means that each sampled block is followed by a clearly defined neighbor at the next echo time TE to be measured.

In the present example, however, it is also the case that within the blocks 5 a further undersampling is performed in which only every second row in the k-space is sampled. This is apparent from FIG. 2 with the aid of the dashed boxes 3. This therefore means that the white, unfilled boxes in FIG. 2 describe unsampled rows of the k-space that lie outside the blocks 5; the widely dashed boxes within the blocks 5 denote rows that are skipped (and accordingly not measured) and the closely dashed boxes 3 within the blocks 5 symbolize rows in which the raw data is actually sampled in step S1. It is furthermore clearly visible from FIG. 2 that in the case of adjacent acquisitions of the same block 5 at different echo times the acquired and the non-acquired rows in the k-space have just been interchanged, such that all essentially provided rows of the blocks 5 are uniformly sampled.

As a result of this undersampling within the blocks 5, a further acceleration of the measurement time by the factor 2 is achieved, with the result that in the present case the acceleration is effected by the factor 6 overall.

The first column 1a, consequently the first measured echo time, plays a special role here. This data is not yet suitable to be used later for a MARTINI reconstruction, so the time window in the example embodiment of the method according to the invention shown here is used in order to acquire calibration data in the k-space center 6 without any undersampling within the "calibration block". The k-space center 6 is in the present case an area comprising four rows around the central point of the k-space. As can be seen from FIG. 2, this calibration data is not undersampled, but is acquired in full. It is used in step S2 in order to interpolate the rows omitted within the blocks 5 (widely dashed boxes 3).

Since the magnetic resonance device used is embodied for parallel imaging, i.e. receives signals of different receive coil elements separately via a plurality of receive channels, this also means that a magnetic resonance signal is received redundantly via the different receive channels, i.e. a significantly better database is present which permits missing magnetic resonance data within the blocks 5 (widely dashed boxes 3) to be derived from the actually sampled raw data (closely dashed boxes 3 of the blocks 5).

This is explained in more detail by FIG. 3. Here, individual points in the phase encoding direction 2 are shown in each case, a closely dashed point 7 meaning that raw data has been sampled at this position in the k-space, while an unfilled point 8 means that this position belongs to an unsampled row (widely dashed box in FIG. 2). The different receive channels are designated by C1 to Cn, where n can amount to 32, for example.

If a magnetic resonance data item is now to be determined for a specific receive channel, in this case channel C2 for example, at an unsampled position, symbolized here by the widely dashed circle 9, all of the acquired raw data of adjacent positions and of all of the receive channels C1 to Cn are taken into account in a weighted manner according to the arrows 10.

In the case of the GRAPPA algorithm used here, the weighting factors are described by way of an interpolation kernel which is determined from the calibration data that was acquired in the k-space center 6 in step S1. Methods for determining the interpolation kernel are already widely known in the prior art, with reference being made here in particular to the article on the GRAPPA technique cited in the introduction. In this case the interpolation takes place in the k-space, in which regard it should additionally be noted that the calibration data is not taken into account for the MARTINI reconstruction now following in step S3.

Only the omitted rows within the blocks 5 are therefore interpolated in step S2, with the result that the raw data in combination with the interpolation data forms magnetic resonance data which describes fully sampled blocks 5 and consequently can be used for the MARTINI technique which is now applied in step S3. In the present case the generally known MARTINI reconstruction technique is used unchanged, though this will be described once again in the interests of a more precise explanation with reference to FIG. 4. What is concerned here is an iterative reconstruction technique which is based on the premise that, starting from a hypothesis for the parameter maps that are to be determined, in this case proton density and T2 parameter maps by way of example, hypothesis data can be derived with the aid of a signal model describing the resulting magnetization, and the hypothesis data can be compared with the acquired magnetic resonance data.

Figure 4:
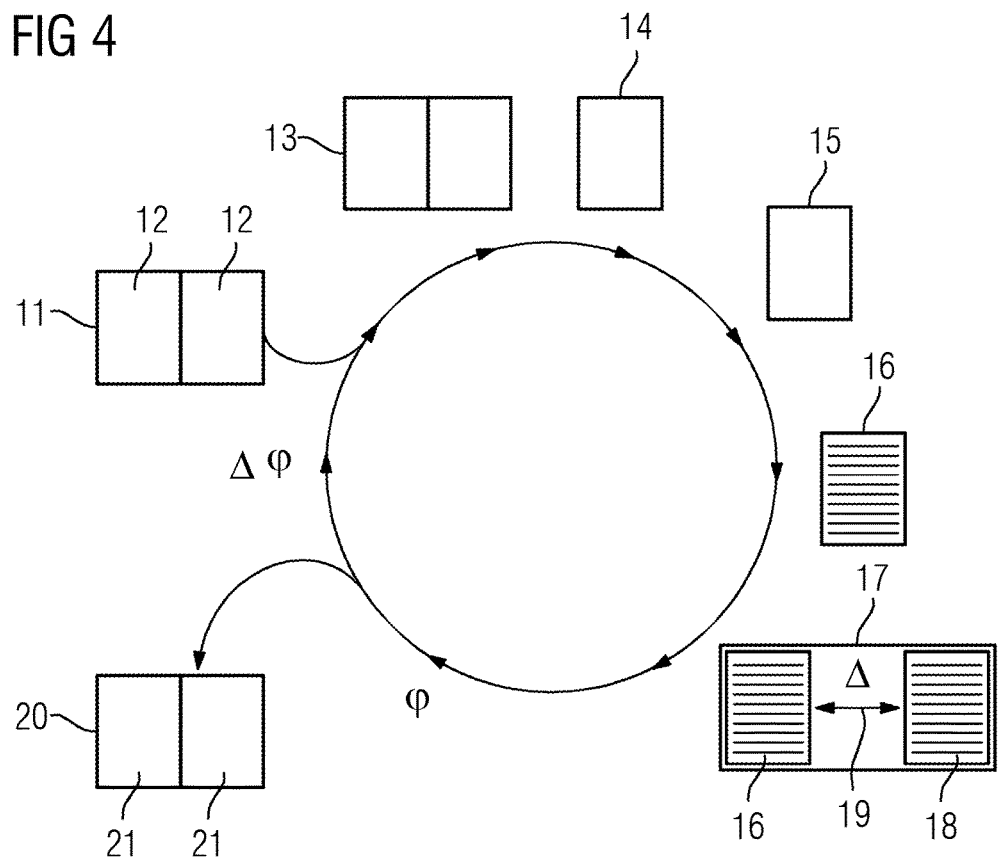
FIG. 4 shows a schematic illustrating the workflow of the MARTINI reconstruction used.

In concrete terms, the MARTINI reconstruction according to FIG. 4 starts with an initial hypothesis 11 for the parameter maps 12. This serves in the first iteration step as a current hypothesis 13 to which the signal model can be applied in a further step, which means that it is possible to determine, from the assumed values for the proton density and T2 for each location in the target region, as well as for each location in the target region, the magnetization which was measured as the magnetic resonance signal at the echo times, such that a hypothetical image dataset 14 is produced here as the result. In the following step, this is transferred into the k-space by Fourier transformation, cf. k-space dataset 15.

In the next step, a synthetic undersampling is applied to the k-space dataset 15, which is to say in the present case that the blocks 5 according to FIG. 2 are considered as sampled, thereby resulting in the hypothesis data 16. In a further step 17, the hypothesis data 16 is now compared with the magnetic resonance data 18 determined in step S2 and derived from the raw data, cf. arrow 19, with the result that a deviation can be determined.

This deviation can be fed in a following step into a cost function which is tested against abort criteria of the optimization. If an abort criterion is met, in other words, for example, a maximum number of iteration steps have been performed or the deviation between the hypothesis data and the magnetic resonance data lies below a deviation threshold value, the MARTINI reconstruction is terminated and as the end result 20 the last current hypothesis is obtained as parameter maps 21.

If the abort criterion is not met, there follows in the next step according to FIG. 4, indicated by $\nabla\Phi$, an optimization step, which means that the last hypothesis is improved, with the result that a new current hypothesis 13 is produced.

The addition of the GRAPPA technique renders the MARTINI reconstruction more robust, with the result that high-quality data can be obtained even with a shorter measurement time.

Figure 5:
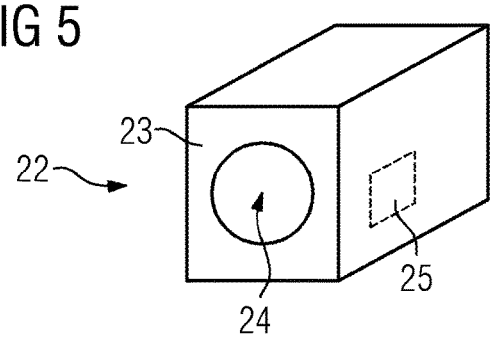
FIG. 5 shows a magnetic resonance device according to an embodiment of the invention.

Finally, FIG. 5 shows a schematic diagram of a magnetic resonance device 22 according to the invention. This comprises, as is generally known, a basic field magnet unit 23 which defines a patient receiving chamber 24 into which the patient can be introduced. In this case the target region is placed in the homogeneity zone. A gradient coil array and a radiofrequency coil array are arranged surrounding the patient receiving chamber, though it is of course possible also to use local coils having a plurality of transmit and/or receive coil elements for parallel imaging purposes.

All of these components are actuated by a control device 25, which is also embodied for carrying out the method according to the invention. Toward that end, the control device 25 comprises a sequencer unit for the purpose of actuating the other components of the magnetic resonance device 22 in order to acquire the raw data, an interpolation unit for performing the GRAPPA technique, and a reconstruction unit for determining the parameter maps 21 by way of the MARTINI reconstruction technique.

Although the invention has been illustrated and described in greater detail on the basis of the preferred example embodiment, the invention is not limited by the disclosed examples and other variations can be derived herefrom by the person skilled in the art without leaving the scope of protection of the invention.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magneto-optical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for recording a parameter map of a target region via a magnetic resonance device, comprising:
    using an optimization method for iterative reconstruction of the parameter map, the optimization method including,
        assessing a deviation between undersampled magnetic resonance data of the target region present in a k-space for different echo times and hypothesis data, the hypothesis data being based on a function of the parameter from a model for the magnetization, wherein
            magnetic resonance data of a respective portion in a phase encoding direction of the k-space is present for each echo time, and
            undersampled raw data is acquired within the portions in the phase encoding direction via the magnetic resonance device and missing magnetic resonance data within the portions in the phase encoding direction is completed by way of interpolation to determine the magnetic resonance data of the respective portion in the phase encoding direction of the k-space, the magnetic resonance device being configured for parallel imaging, each of the portions in the phase encoding direction representing a group of consecutive phase encoding steps that is less than all of the phase encoding steps and at least a part of the missing magnetic resonance data is between two phase encoding steps in which at least part of the raw data is acquired, and
        terminating the optimization method if (i) a number of iterations performed exceed a iteration threshold value, (ii) the deviation is below a deviation threshold old value, or (iii) the number of iterations performed exceed the iteration threshold value and the deviation is below the deviation threshold value.

2. The method of claim 1, further comprising:
    reconstructing the parameter map according to a model-based accelerated relaxometry by iterative non-linear inversion (MARTINI) reconstruction technique, and
    acquiring and interpolating the missing magnetic resonance data according to a generalized auto-calibrating partial parallel acquisition (GRAPPA) method.

3. The method of claim 1, further comprising:
    Cartesian sampling the k-space at a first echo time within at least one of the portions, Cartesian sampling includes sampling only every second row of the at least one of the portions in the phase encoding direction of the k-space.

4. The method as claimed in claim 3, wherein the Cartesian sampling includes,
    Cartesian sampling the k-space at a different echo time than the first echo time, the rows sampled immediately at the first echo time are not sampled and previously omitted rows for the first echo time are sampled.

5. The method of claim 1, wherein the k-space is subdivided in the phase encoding direction into three to five portions.

6. The method of claim 1, wherein, for interpolation purposes, the raw data acquired adjacently in respect of a position of a missing magnetic resonance data item in the k-space is taken into account in a weighted manner in accordance with an interpolation kernel.

7. The method of claim 6, wherein the interpolation kernel is determined from calibration data of the target region acquired via the magnetic resonance device.

8. The method of claim 7, further comprising:
    acquiring the calibration data during measurement of the raw data, by non-undersampled acquisition of a k-space center at a first measured echo time.

9. The method of claim 1, further comprising:
    determining a T2 parameter map, T2* parameter map or a T1 parameter map.

10. A magnetic resonance device, comprising:
    a control device configured to carry out the method of claim 1.

11. The method of claim 2, further comprising:
    Cartesian sampling the k-space at a first echo time within at least one of the portions, the Cartesian sampling includes sampling only every second row of the at least one of the portions in the phase encoding direction of the k-space.

12. The method as claimed in claim 11, wherein the Cartesian sampling includes,
    Cartesian sampling the k-space at a different echo time than the first echo time, the rows sampled immediately at the first echo time are not sampled and previously omitted rows for the first echo time are sampled.

13. A magnetic resonance device, comprising:
    a control device configured to carry out the method of claim 2.

14. The method of claim 1, wherein the optimization method includes,
    undersampling magnetic resonance raw data using parallel imaging; and
    undersampling the magnetic resonance raw data in accordance with a model-based method.

* * * * *